United States Patent
Alizadeh et al.

(10) Patent No.: US 7,122,827 B2
(45) Date of Patent: Oct. 17, 2006

(54) MONOLITHIC LIGHT EMITTING DEVICES BASED ON WIDE BANDGAP SEMICONDUCTOR NANOSTRUCTURES AND METHODS FOR MAKING SAME

(75) Inventors: Azar Alizadeh, Wilton, NY (US); Pradeep Sharma, Saratoga Springs, NY (US); Steven Francis LeBoeuf, Schenectady, NY (US); Suryaprakash Ganti, Guilderland, NY (US); Mark Philip D'Evelyn, Niskayuna, NY (US); Kenneth Roger Conway, Clifton Park, NY (US); Peter Micah Sandvik, Guilderland, NY (US); Loucas Tsakalakos, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 9 days.

(21) Appl. No.: 10/686,136

(22) Filed: Oct. 15, 2003

(65) Prior Publication Data

US 2005/0082543 A1   Apr. 21, 2005

(51) Int. Cl.
*H01L 29/06* (2006.01)
(52) U.S. Cl. ............................. 257/17; 257/14; 257/22
(58) Field of Classification Search .............. 257/9–18, 257/22
See application file for complete search history.

(56) References Cited

U.S. PATENT DOCUMENTS

| | | | |
|---|---|---|---|
| 6,501,091 B1 | 12/2002 | Bawendi et al. | |
| 6,709,881 B1 * | 3/2004 | Hasegawa et al. | 438/24 |
| 2001/0007242 A1 | 7/2001 | Davis et al. | |
| 2001/0008791 A1 | 7/2001 | Gehrke et al. | |
| 2003/0089899 A1 | 5/2003 | Lieber et al. | |

FOREIGN PATENT DOCUMENTS

WO    WO 02/44444    6/2002

OTHER PUBLICATIONS

Arakawa et al., "Multidimensional quantum well laser and temperature dependence of its threshold current," Appl. Phys. Lett., 40(11), 1982, pp. 939-941.
Damilano et al., "From visible to white light emission by GaN quantum dots on Si(111) substrate," Appl. Phys. Lett., 75(7), 1999, pp. 962-964.
Jain et al., "Edge-induced stress and strain in stripe films and substrates: A two-dimenssional finite element calculation," J. Appl. Phys., 78(3), 1995, pp. 1630-1636.
Jain et al., "III-nitrides: Growth, Characterization, and properties," J. Appl. Phys., 87(3), 2000, pp. 965-1006.
Kim et al., "Nanoscale Ultraviolet-Light-Emitting Diodes Using Wide-Bandgap Gallium Nitride Nanorods," Adv. Mater., 15(7-8), 2003, pp. 567-569.

(Continued)

*Primary Examiner*—Hung Vu
(74) *Attorney, Agent, or Firm*—Winstead Sechrest & Minick; Edward T. Mickelson

(57) ABSTRACT

The present invention is directed toward a method for fabricating low-defect nanostructures of wide bandgap materials and to optoelectronic devices, such as light emitting sources and lasers, based on them. The invention utilizes nanolithographically-defined templates to form nanostructures of wide bandgap materials that are energetically unfavorable for dislocation formation. In particular, this invention provides a method for the fabrication of phosphor-less monolithic white light emitting diodes and laser diodes that can be used for general illumination and other applications.

18 Claims, 9 Drawing Sheets

OTHER PUBLICATIONS

Kim et al., "Nano-Scale Island (Dot)-Induced Optical Emission in InGaN Quantum Wells," J. Kor. Phys. Soc., 39(1), 2000, pp. 141-146.

Li et al., "Dense arrays of ordered GaAs nanostructures by selective area growth on substrates patterned by block copolymer lithography," Appl. Phys. Lett., 76(13), 2000, pp. 1689-1691.

Mansky et al., "Large-Area Domain Alignment in Block Copolymer Thin Films Using Electric Fields," Macromolecules, 31, 1998, pp. 4399-4401.

Murray et al., "Synthesis and Characterization of Nearly Monodisperse CdE (E=S, Se, Te) Semiconductor Nanocrystallites," J. Am. Chem. Soc, 115,1993, pp. 8706-8715.

Micic et al., "Size-Dependent Spectrocopy of InP Quantum Dots," J. Phys. Chem. B, 101, 1997, pp. 4904-4912.

Sharma et al. "Effect of surfaces on the size-dependent elastic state of nano-inhomogeneities," Appl. Phys. Lett., 82(4), 2003, pp. 535-537.

Sharma et al., "Interfacial elasticity corrections to strain-state of embedded quantum dots," Rapid Research Note, Phys. Stat., Sol. B, 234(3), 2002, pp. R10-R12.

Thurn-Albrecht et al., "Ultrahigh-Density Nanowire Arrays Grown in Self-Assembled Diblock Copolymer Templates," Science 290 2000, pp. 2126-2129.

Zhong et al., "Synthesis of p-Type Gallium Nitride Nanowires for Electronic and Photonic Nanodevices," Nano Letters, 3(3), 2003, pp. 343-346.

* cited by examiner

A

B

A

B

MONOLITHIC LIGHT EMITTING DEVICES BASED ON WIDE BANDGAP SEMICONDUCTOR NANOSTRUCTURES AND METHODS FOR MAKING SAME

TECHNICAL FIELD

The present invention relates generally to electroluminescent light sources, and more specifically to the use of nanolithography to enable the generation of low-defect nanostructures and to tailor the emission of such light sources to a particular wavelength or range of wavelengths by exploiting quantum confinement and surface elasticity effects.

BACKGROUND INFORMATION

A key challenge, and also a main research focus in the development and application of wide band gap technology, particularly gallium nitride (GaN), is the lack of high quality, cost effective and low-defect materials. Due to a lack of a commercially available low-defect GaN substrate material, GaN is commonly grown on substrates such as sapphire, silicon carbide, zinc oxide, silicon, etc. High densities of threading dislocation ensue due to lattice and thermal mismatches with these substrates. Lateral epitaxial overgrowth, pendeo-epitaxy, and bulk homo-epitaxial growth techniques have been proposed to improve the quality of GaN material, yet none of these techniques are currently optimal. What is desired is a fabrication technique capable of producing high-quality, low-defect gallium nitride at a reasonable cost.

In light emitting sources, such as light-emitting diodes (LEDs), the emission wavelength of light depends on the bandgap of the compound semiconductor. Currently, white or "mixed colored" LEDs are obtained by combining a blue LED with a yellow phosphor. The problems associated with this approach are low emission efficiency, Stokes losses, device lifetime, and complex packaging (because a phosphor layer must be manufactured into the device). Another approach to making white or mixed colored LEDs is to assemble numerous monochromatic red, blue and green LEDs. This approach is very expensive and complex since each of the blue, green and red LEDs have to be addressed independently and a feedback mechanism is needed. Thus, there is a need for a simple monolithic white LED device.

For several years, researchers have touted the utility of quantum dot laser diodes (QDLDs) over standard quantum well laser diodes (QWLDs) (Arakawa et al., Appl. Phys. Lett., 40, 939–941 (1982)). Due to the narrow delta-like density of states associated with quantum dots (QDs), lower threshold currents are required for lasing. Further, QDs can alleviate the deleterious effects of unintentional defects in the active region, due to their exceptional carrier capture cross-sections. However, current attempts to capitalize on QDs for lasing applications are limited by the inability to form uniform, monodisperse dots throughout a film. While monodispersion is often not a concern for LEDs, it is especially important for laser diodes (LDs), where the generation of coherent, single phase light is essential. Thus, a more practical method of generating uniform, monodisperse QDs would be desirable.

Quantum confinement and other surface effects influence the emission wavelength when the structural length scale reaches the nano-regime. Hence, for a given material composition, different emission wavelengths across the entire electromagnetic spectrum can be achieved by varying the size of the nano-structural features (e.g., CdSe, AlGaN, InP, J. Phys. Chem. B, 101, pp. 4904–4912, 1997; J. Am. Chem. Soc., 115, pp. 8706, 1993; Appl. Phys. Lett., 75, pp. 962–965 1999; J. Korean Phy. Society, 39, p. 141, 2000). It has also been recognized that nanostructures such as quantum dots and quantum wells are key components of light emitting sources. In conventional wide bandgap based LEDs, these nanostructures are formed naturally and exhibit broad size and composition distributions. Control over the uniformity (both size and composition) of these nanostructures in the active layer of the LED devices remains a major challenge, however. Though some researchers have reported "white" electroluminescence using disperse self-assembled InGaN quantum dots (Jpn. J. Appl. Phys., 40. pp. L918–L920, 2001), these were not, however, made by a templated growth method. The device itself was based on multiple quantum wells, and the internal quantum efficiencies were severely limited by size disorder and spatial non-uniformity. Efficient monolithic white LEDs will require intelligent nanostructuring (e.g., nanolithography) of the quantum confined active region.

Defect reduction through strain relief inside 3-dimensional (3-D) confined nanostructures grown on lattice-mismatched substrates has not yet been attempted based upon a systematic size and shape optimization via physical modeling of the phenomena of dislocation nucleation. Related art is restricted to defect reduction in substrate mismatched wide bandgap thin films and 2-dimensional structures using techniques such as lateral epitaxial overgrowth (U.S. patent application Ser. No. 09/780,069), pendeo-epitaxy (U.S. patent application Ser. No. 09/780,715), nano-lateral epitaxial overgrowth (U.S. patent application Ser. No. 10/273, 926), and nano-columnar overgrowth (World Intellectual Property Organization Application Publication No. WO 02/44444 A1) among others.

Cuomo et al. (International Patent Application No. PCT/US01/44992) have demonstrated the formation of nanoscale columnar structures using a sputtering transport technique. This method has been shown to improve GaN epitaxy by alleviating thermal strain between the patterned substrate and the GaN film. However, this technique does not generate low-defect GaN because the sputtered structures cannot be controllably ordered and made monodisperse. Further, the techniques used to generate the nano-columns rely on sputtering conditions and not nanolithography patterning.

Bawandi et al. (U.S. Pat. No. 6,501,091 B1) have proposed a method for the fabrication of quantum dot white and colored light emitting diodes. The technology proposed by these authors is based on the colloidal synthesis of group II–VI semiconductors, such as CdSe and CdS, and their tailored dispersion in a transparent host matrix. The size and distribution of the quantum dots is chosen to emit light of monochromatic or white color. This method, however, is very different from the present invention since the particular LED device proposed by Bawandi et al. must be activated (illuminated) by another LED of shorter wavelength.

Lieber et al. (U.S. patent application Ser. No. 10/196,337) have proposed methods of growing semiconductor nanostructures (particularly, III–V semiconductor nanorods and nanotubes, such as GaN) that emit light. The nanorods can be further doped (n- or p-type), and p-n junctions within the same nanorod can be made. Furthermore, the rods can be addressed electrically and LED devices can be fabricated. However, Lieber et al. have only succeeded in making monochromatic (single wavelength) LEDs.

Block co-polymers have been used for the templated growth of monodisperse metallic quantum dots and nanowires (Science, 290, p. 2126, 2000). Block co-polymers have also been used for the templated growth of monodisperse semiconductor quantum dots, in particular AlGaAs on a GaAs substrate (Appl. Phys. Lett., 76, p. 1689, 2000). However, InGaAs and GaAs have very similar lattice parameters. To date, however, block co-polymers (or other lithographic techniques) have not been used for the templated growth of quantum dots (or other nanostructures) that present a large lattice mismatch with the corresponding substrate.

What is desired is a method capable of producing large and dense arrays of low-defect nanostructures (e.g., quantum dots) with arbitrary size and spacing on substrates that may or may not have a large lattice mismatch with the nanostructured material, and to be able to use such arrays in light emitting devices.

SUMMARY OF THE INVENTION

The present invention is directed toward methods for templated growth of size-controlled (e.g., quantum confined) low-defect wide bandgap semiconductor nanostructures. The present invention is also directed toward novel monolithic light-emitting diode (LED) devices comprising low-defect wide bandgap nanostructures and methods for making same. Such devices can produce white light, or they can produce monochromatic radiation. In embodiments producing monochromatic emission, the emitted light can be coherent in nature for use as a laser diode.

The present invention provides a fabrication technique for the production of high-quality low-defect wide bandgap nanostructures with a high level of size control and/or uniformity. Such nanostructures can also be made with ultrahigh density. In some embodiments of the present invention, the low-defect wide bandgap nanostructures are grown on substrates that have a large lattice mismatch with the wide bandgap nanostructure material, wherein a large lattice mismatch is greater than about 2 percent.

The present invention provides a simple, monolithic white LED device based on quantum confined, low-defect wide bandgap nanostructures of varying size. Reduction in defects and greater control over size significantly increases the tunability and emission efficiency of the LED.

By providing greater control over size uniformity, the present invention also provides a practical method for uniformly generating monodisperse quantum dots which can be used in quantum dot laser diodes (QDLDs) to produce monochromatic light.

The present invention provides a method of using nanolithographic techniques and exploiting quantum confinement and surface elasticity effects to intelligently nanostructure materials for use as efficient, monolithic white LEDs. Control over the types of materials, size effects, and surface effects permits the tuning of emission wavelengths by a number of different parameters, and the combination of quantum confinement and surface elasticity effects permits the tuning of the emission on larger size scales, making fabrication easier and less expensive.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
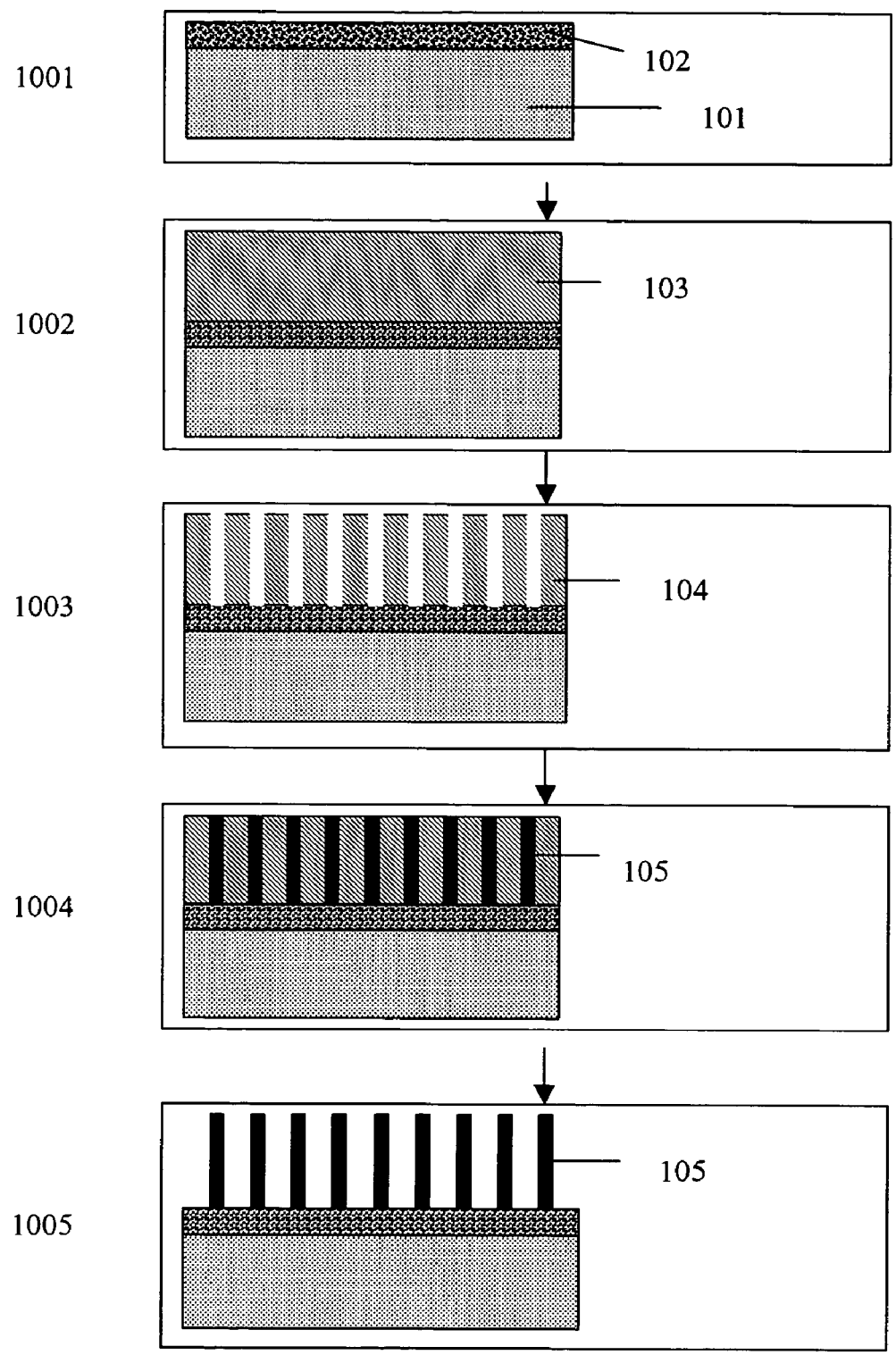
FIG. 1 illustrates fabrication steps for the templated growth of low-defect wide bandgap nanostructures.

In the following description, specific details are set forth such as specific quantities, sizes, etc. to provide a thorough understanding of the present invention. However, it will be obvious to those skilled in the art that the present invention may be practiced without such specific details. In many cases, details concerning such considerations and the like have been omitted inasmuch as such details are not necessary to obtain a complete understanding of the present invention and are within the skills of persons of ordinary skill in the relevant art.

The present invention is directed, in some embodiments, to the preparation of nanostructures of low-defect wide bandgap semiconductor material. In some of these embodiments, the low-defect wide bandgap nanostructures are used to make light emitting devices, wherein their light emission characteristics can be tuned by an appropriate selection of materials, quantum confinement effects, and surface elasticity effects. In some embodiments, these light emitting devices generate white light, whereas in other embodiments they produce monochromatic light.

"Wide bandgap [semiconductor] materials," as used herein, refers to semiconductors and compound semiconductors having direct and/or indirect bandgaps that range in energy generally from about 0.7 electron volts (eV) to about 7 eV, and more specifically from about 2.5 eV to about 6.5 eV. Such wide bandgap materials, according to the present invention, can also include doped dielectric materials.

"Group III nitrides," as used herein, refers to nitrides of the Group IIIA elements and include binary, ternary, and quaternary compounds, e.g., BN, AlN, GaN, InN, TlN, $In_xGa_{1-x}N$, $Al_xGa_{1-x}N$, $Al_xIn_yGa_{1-x-y}N$, etc., all of which represent a subset of wide bandgap materials.

"Low-defect," as used herein, refers to wide bandgap nanostructures having less than about $10^{11}$ dislocations $cm^{-2}$. In some embodiments, selection of nanostructure growth methods and/or optimization of strain reduction effects can permit the number of defects to be reduced below about $10^6$ dislocations $cm^{-2}$, and in some embodiments below about $10^4$ dislocations $cm^{-2}$.

"Quantum confinement," as used herein, refers to wide bandgap materials that have had their dimensions reduced below that of their Bohr exciton radius, thereby increasing their bandgap.

"Surface confinement," as used herein, refers to wide bandgap materials embedded in a matrix of another material, which results in a bandgap change due to interface elasticity and surface tension effects.

"Quantum rods," as used herein, refers to nanostrucures of wide bandgap material having quantum confinement in two dimensions.

"Quantum wires," as used herein, refers to nanostructures of wide bandgap material having quantum confinement around an axis of symmetry.

"Quantum dots," as used herein, refers to quantum confined nanostrucures of wide bandgap material, generally existing as "islands" on a substrate surface.

"Homogeneous nanostructures," as used herein, refers to nanostructures of wide bandgap material that have the same size and shape, monodisperse quantum dots being an example.

"Heterogeneous nanostructures," as used herein, refers to nanostructures of wide bandgap material that vary in size and shape.

Low-defect Wide Bandgap Nanostructures

The present invention, in a number of embodiments, involves the growth of 3-dimensional low-defect wide bandgap materials in pre-patterned substrate molds possessing nanolithographically-defined (patterned) nanoscale features. In some embodiments of the present invention, the wide bandgap material is a group III nitride, of which GaN is prototypical. Growth of these low-defect wide bandgap materials is accomplished using techniques which include, but are not limited to, chemical vapor deposition (CVD), metal-organic chemical vapor deposition (MOCVD), molecular beam epitaxy (MBE), laser ablation, atomic layer deposition, liquid phase epitaxy, high pressure temperature-gradient recrystallization, high pressure solution growth, sublimation, and combinations thereof The benefit of this method is that, in some embodiments, low-defect nanostructured materials can be grown on substrates with which they have a large lattice mismatch.

A three-dimensional model has been developed to predict and optimize the nano-template chemical composition, geometry and dimensions for which low-defect wide band gap nanostructures are obtained. The models for misfit dislocation nucleation are formulated with the aid of numerical finite element simulations and known dislocation energetics.

In some embodiments of the present invention, based on the above modeling results and using a variety of nano-patterning techniques, including block copolymer lithography, e-beam lithography, extreme ultraviolet (EUV) lithography, embossing (nano-imprinting), 2-dimensional colloidal crystal lithography, soft lithography, or a combination of them, pre-patterned substrates for the templated growth of wide bandgap nanostructures, such as GaN, are fabricated.

The pre-patterning procedure of the present invention can be described generally. Referring to FIG. 1, a nucleation or buffer layer 102, such as AlN or defective GaN, may be deposited on or over a substrate 101, as shown in step 1001. In some embodiments, the nucleation layer 102 may be omitted, such as in the case of growing GaN nanostructures on a bulk GaN substrate. The thickness of the nucleation layer 102 can typically range from about 20 nanometers (nm) to about 50 nm. Next, in step 1002, a sacrificial dielectric layer 103 such as silicon nitride or silicon dioxide, is deposited on or over the nucleation or buffer layer 102. In step 1003, one or more of a variety of nano-lithographic techniques, such as those enumerated above, is used to pattern the dielectric layer 103, resulting in a nano-porous or nanostructured template or mold 104. Generally, optimum results are obtained for nano-pore radii below about 30 nm and, perhaps, more optimally below about 20 nm. Nanostructures of wide bandgap material 105, such as GaN, can then be grown inside these nano-templates using conventional growth techniques such as MOCVD, MBE, laser ablation, etc., as shown in step 1004. During this templated growth process, selective nucleation and growth of wide bandgap material inside the nano-pores will take place, while no nucleation or growth of wide bandgap material on top of the sacrificial dielectric matrix occurs. MOCVD, MBE or laser ablation growth parameters are controlled to optimize the quality and uniformity of the crystalline wide bandgap material nano-islands. Growth of wide bandgap material nano-islands will be interrupted once their heights match the height of the dielectric nano-porous templates 104. Continued lateral overgrowth of low-defect wide bandgap material epitaxial films, forming a uniform plane of low-defect wide bandgap material, has been discussed previously. See commonly assigned U.S. patent application Ser. No. 10/273,926, incorporated herein by reference. Finally, if desired, the dielectric nano-template 104 can be removed, as shown in step 1005, using conventional semiconductor practices such as hydrofluoric acid treatment.

Regarding the lithography techniques employed in some embodiments of the present invention, using e-beam lithography it is possible to obtain size features below about 30 nm. Embossing and nano-imprinting, in some embodiments, can be used with e-beam lithography in a complementary manner, such that a mask with a desired pattern is fabricated using e-beam lithography, then an embossing (nano-imprinting) technique is used to replicate that pattern multiple times.

Regarding block co-polymer lithography, as used in some embodiments of the present invention, block co-polymer thin films have been used as lithographic masks in a variety of nano-patterning applications with feature sizes in the range of about 10–100 nm. The principles of block co-polymer lithography are similar to, and inspired by, conventional UV-based photolithographies. In conventional photolithography, a polymer photoresist is exposed to UV light through a prefabricated mask. The UV exposed regions of the photoresist degrade and can be easily removed (developed) to produce a desired pattern. The smallest size features produced in this traditional manner are limited to 100 nm due to the wavelength limit of UV light and its interactions with the mask. This limitation is overcome by using block co-polymer lithography where no prefabricated masks are required. In fact, the self-assembled block co-polymer serves as a mask and a photoresist simultaneously. Furthermore, with block co-polymer lithography, patterns can be generated with simple monodisperse features which are adequate for monochromatic light emitting device (e.g., laser diodes) embodiments of the present invention. However, for embodiments desiring the templated growth of quantum dots with arbitrary (varying) size and spacing, a combination of e-beam lithography and embossing may be employed.

With the nano-patterning methods utilized here, an extremely dense array of nanostructures of low-defect wide bandgap material can be generated. For instance using block co-polymer lithography, the density of wide bandgap material nanostructures can be as high as $10^{11}$ quantum dots/cm$^2$ over very large areas (e.g., 2 inch, 4 inch, and 8 inch wafers).

Monolithic White LEDs

Figure 2:
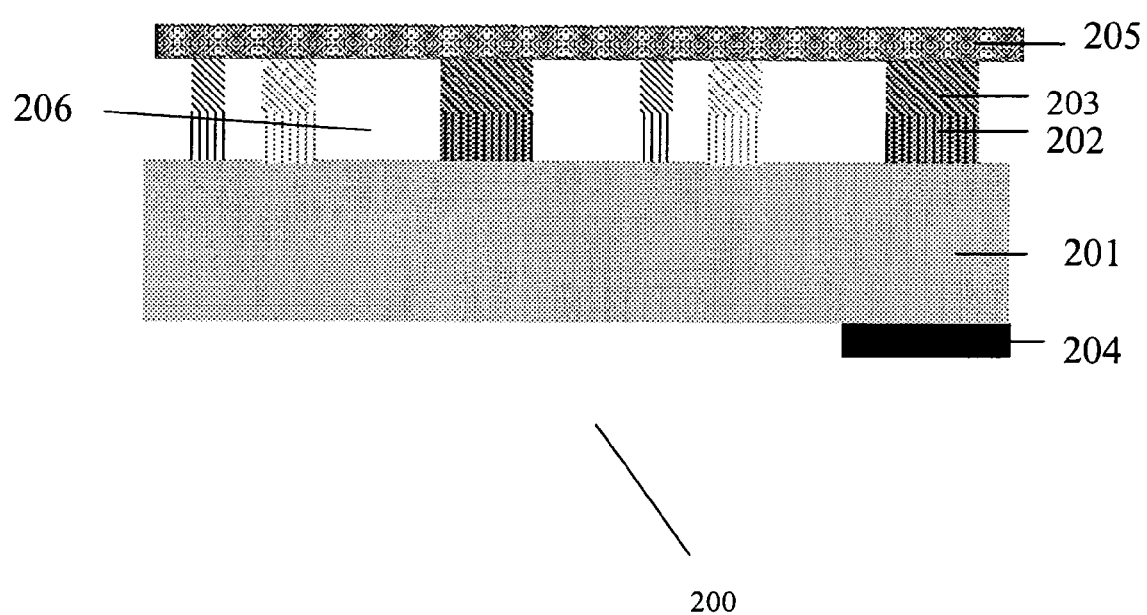
FIG. 2 illustrates a monolithic white light emitting diode device comprising wide bandgap nanostructures, wherein p-n junctions are created inside the nanostructures.

FIG. 2 is a schematic illustration of a generic monolithic white LED device, according to a number of embodiments of the present invention, and one that is based on an array of wide bandgap nanostructures of varying sizes. Wide bandgap nanostructures of varying size and shape are grown directly on a conductive substrate 201 such as silicon carbide or doped silicon. The bottom portion of the wide bandgap nanostructure of FIG. 2 is an n-type quantum dot (QD) 202, whereas the top portion 203 is a p-type QD. The conductive substrate 201 can also serve as a bottom electrode. In some embodiments, a metallic electrode 204 is deposited on the bottom of the substrate 201 and provides an ohmic contact. The composition and annealing treatment for the electrode 204 depends on the choice of materials for the bottom substrate 201, and such selections are well known in the art. 206 can be any material capable of electrical confinement and passivation (e.g., $SiO_2$) or vacuum. In situ p-type or n-type doping of the wide bandgap nano-structures can be accomplished by adjusting the CVD, MOCVD, MBE, laser ablation, etc. growth parameters. For instance, using magnesium or zinc impurities, p-type GaN can be easily obtained. On the other hand, incorporation of Si impurities or the presence of nitrogen vacancies and/or oxygen impurities can easily result in a doping level of $\sim 10^{18}/cm^3$, giving rise to n-type GaN. By tuning the growth parameters during the synthesis of wide bandgap nanostructures, p-n junctions inside the individual rods/islands can be created. In fact, several reports (Adv. Mater. 15, pp. 567, 2003, Nano Lett. 3, pp. 343, 2003) have previously demonstrated n- and p-type doping and p-n junctions in nanorods (nanowires).

The growth of white UV emitters will typically begin by forming a QD active region on a nano-patterned substrate and then commencing growth with a p- or n-type contact layer. The patterned substrate may include $SiO_2$ or some other patterned mask, which may or may not be removed before or after the formation of the contact layer. The QDs are tuned in size to generate multiple wavelengths of light, which combine to form white light. In some embodiments, for example, intensity mixing of QDs sized to generate 30% red light, 59% green light, and 11% blue light, will collectively generate white light. Finally, the top electrode 205 can be directly deposited on top of the array of quantum dots 202, 203. This metallic top layer electrode 205 is generally made thin to permit the white or colored electromagnetic radiation generated from the nano-structured wide bandgap emitters to pass through it. A typical upper thin electrode is an ~3 nm thick layer of nickel, titanium, chromium, or combinations thereof, followed by an ~15 nm thick layer of gold. In some embodiments, the top electrode 205 may also be highly reflective to direct light through the substrate side of the device. Such a process is called "flip-chipping."

In some embodiments of the present invention, a series of nano-porous templates with different pore sizes is generated, followed by the deposition of a single type of wide bandgap semiconductor compound inside them. The emission wavelength of the nano-structured wide bandgap semiconductor will be dependent on the pore size of the nano-template. Thus, where it is desired to produce white light from a monolithic LED device, a porous nano-template with varying spacing and pore sizes across it must be fabricated. A single type wide bandgap semiconductor is then deposited inside the nano-pores of the template. The emission wavelength of the individual templated wide bandgap nano-islands depends on their size, however, and the emission wavelength of the assembly can be tuned from the deep UV to the infrared regions of the electromagnetic (EM) spectrum by tailoring the spacing and pore sizes of the original template, and by appropriately choosing the composition of the semiconductor compound.

While not necessarily requiring every element enumerated herein, a light emitting device of the present invention generally comprises: 1) a bottom electrode material; 2) a substrate in contact with the bottom electrode; 3) a nucleation layer in contact with the substrate; 4) nanostructures of wide bandgap material comprising an n-type portion and a p-type portion, a portion being in contact with said nucleation layer; and 5) a top electrode in contact with a portion of the nanostructures of wide bandgap material.

According to the present invention, the substrate 201 can be selected from materials which are conducting, semiconducting or insulating. Examples of substrate materials include, but are not limited to, SiC, sapphire ($Al_2O_3$), ZnO, doped Si, AlN, InN, AlGaN, InGaN, AlInGaN, lithium gallate ($LiGaO_2$), $SiO_2$, diamond, and combinations thereof In some embodiments of the present invention, the substrate comprises bulk GaN with a dislocation density below about $10^4$ $cm^{-2}$, as described in commonly assigned U.S. patent application Ser. No. 10/329,981 which is hereby incorporated by reference. This can serve as a substrate/nucleation layer for GaN nanostructures, or other wide bandgap materials.

The electrodes may vary in thickness and be comprised of any reasonably conductive material suitable for establishing ohmic contact. Examples of suitable n-electrode materials include, but are not limited to, Al, Ti, Ta, W, In, indium tin oxide (ITO), Au, and combinations thereof Examples of suitable p-electrode materials include, but are not limited to, Ni, Ag, nickel oxide, In, Mg, ITO, Au, Rh, and combinations thereof. In some embodiments of the present invention, the substrate layer serves as an electrode.

The nucleation layer may have a thickness which ranges generally from about a partial monolayer to about 1000 nm, and specifically from about 10 nm to about 50 nm. The nucleation layer can comprise any material which suitably provides for a nucleation layer of the present invention. Such materials include, but are not limited to, GaN, AlN, InN, BN, $B_xAl_yIn_zGa_{1-x-y-z}N$, and combinations thereof In some embodiments, the substrate layer 201 serves as a nucleation layer.

Nanostructures, according to the present invention, are nanoscale structures of wide bandgap semiconducting materials. In some embodiments, these nanostructures are selected from the group consisting of quantum confined nanostructures, surface confined nanostructures, low-defect nanostructures, and combinations thereof The nanostructures can comprise quantum dots, quantum wires, and combinations of each, and they can be of the same (homogeneous) or different (heterogeneous) size, arrayed on a surface at varying distances or equidistant from one another. The distances between the wide bandgap nanostructures generally range from about 10 nm to about 1 μm, and the density of the nanostructures (e.g., quantum dots) on a surface generally ranges from about $10^8$ nanostructures/$cm^2$ to about $10^{12}$ nanostructures/$cm^2$. Note, however, that when the distance between the nanostructures is small, the properties of the nanostructures may be influenced by proximity effects such as optical coupling. The wide bandgap material of which they are composed can be any material which suitably provides for light emitting devices, according to the present invention, and includes, but is not limited to, GaN, InGaN, InN, AlGaN, AlInGaN, AlP, GaP, InP, AlInGaP, and combinations thereof In some embodiments, the nanostructures of wide bandgap material comprise a planar geometry configuration. In some embodiments, the wide bandgap material and the nucleation layer comprise the same material.

In a number of embodiments of the present invention, the wide bandgap material comprising the nanostructures is doped with one or more doping elements. The level of doping can range from about $10^{15}$ atoms/cm$^3$ to about $10^{20}$ atoms/cm$^3$, and it can be of the p-type, n-type, or a combination of the two. The p-type doping agents include, but are not limited to, Zn, Mg, Mn, C, O, Co, Ca, Ra, Be, Sr, Ba, Zn, Ga-vacancies, and combinations thereof The n-type doping agents include, but are not limited to, oxygen, Si, Co, C, nitrogen vacancies, and combinations thereof In some embodiments, p-type doping and n-type doping exist in single wide bandgap nanostructures such that p-n junctions exist internal to those nanostructures, and wherein the n-type portion is generally in contact with the nucleation layer and the p-type portion is generally in contact with the top electrode.

In some embodiments, the light emitting device of the present invention emits polychromatic EM radiation (light). In some embodiments, the emitted light is white. In other embodiments, the emitted light is monochromatic and can even be coherent. In many embodiments, the light emitting device is free of a phosphor-containing material.

Variations on the above embodiments include embodiments comprising one or more cladding layers between the substrate and the wide bandgap nanostructures and/or between the wide bandgap nanostructures and the top electrode.

While not necessarily requiring every step enumerated herein, the light emitting device of the present invention can generally be made by 1) providing a bottom electrode; 2) contacting a substrate material with the bottom electrode to form a substrate; 3) contacting a nucleation material with the substrate to form a nucleation layer; 4) forming nanostructures of wide bandgap material comprising an n-type portion and a p-type portion such that p-n junction(s) are formed within the nanostructures, wherein the nanostructures of wide bandgap material are selected from the group consisting of low-defect nanostructures of wide bandgap material, quantum confined nanostructures of wide bandgap material, surface confined nanostructures of wide bandgap material, and combinations thereof, and wherein at least one portion of the nanostructures of wide bandgap material is in contact with the nucleation layer; and 5) depositing a top electrode material on top of the wide bandgap nanostructure(s) such that it does not make electrical contact with the bottom electrode.

In some embodiments of the present invention, the substrate material is pre-formed and merely contacted with the electrode material. In other embodiments, the substrate material is deposited by a depositing means. The depositing means can be any method which suitably deposits substrate material onto an electrode and includes, but is not limited to, CVD, laser ablation, vapor deposition, MOCVD, atomic layer deposition, liquid phase epitaxy, high pressure temperature-gradient recrystallization, high pressure solution growth, sublimation, and combinations thereof In some embodiments, the substrate and the electrode comprise the same material.

In some embodiments of the present invention, the nucleation material is contacted with a surface of the substrate material by a contacting means. Suitable methods of contacting the nucleation material with the substrate material (layer) include, but are not limited to, a depositing means.

Where a depositing means is used, a deposition technique is generally selected from the group consisting of CVD, laser ablation, vapor deposition, MOCVD, atomic layer deposition, liquid phase epitaxy, high pressure temperature graded recrystallization, high pressure solution growth, sublimation, and combinations thereof In some embodiments, the nucleation layer and the substrate comprise the same material.

In some embodiments of the present invention, the process of forming nanostructures of wide bandgap material comprises: 1) contacting at least one nano-lithographically lithographically patternable material with the nucleation layer, 2) nano-lithographically patterning the nano-lithographically patternable material with a lithographic means to form molds (templates) for nanostructures of wide bandgap material; 3) depositing an n-doped wide bandgap material into said molds to form nanostructures of n-doped wide bandgap material; and 4) depositing a p-doped wide bandgap material in contact with the n-doped wide bandgap material to form wide bandgap nanostructures of wide bandgap material comprising at least one p-n junction.

In some embodiments of the present invention, the nano-lithographically patternable material comprises an etchable sacrificial dielectric layer and a block co-polymer material. In such embodiments, the etchable sacrificial dielectric layer may be selected from the group consisting of $SiO_2$, $Si_xN_y$, $Al_2O_3$, and combinations thereof, and it can be etched by a method selected from the group consisting of reactive ion etching, chemical etching, and combinations thereof In some of these embodiments, domains of block co-polymer are selectively removed by a means selected from the group consisting of selective chemical reaction, selective radiative interaction, and combinations thereof, to yield a nanostructured mask on the sacrificial dielectric layer.

In some embodiments utilizing a nano-lithographically patternable material, the nano-lithographically patternable material may be selected from the group consisting of conventional photoresists, polymers such as PS and PMMA, block copolymers such as PS-PMMA, PS-PI, PS-PB, PS-polyferrocyline, and combinations thereof. In such embodiments, the nano-lithographically patternable material generally comprises a layer with a pre-patterned thickness that ranges generally from about 10 nm to about 10 µm, and typically from about 25 nm to about 30 nm.

In embodiments employing a lithographic means, the lithographic means may be selected from the group consisting of block co-polymer lithography, electron-beam lithography, extreme UV lithography, embossing (nano-imprinting), 2-dimensional colloidal crystal lithography, soft lithography, and combinations thereof In some embodiments, the lithographic means comprises a masking operation. In general, the molds formed within the lithographically-patternable material are nanosized in a least two dimensions.

In some embodiments, the wide bandgap material is deposited in the nanostructured molds or templates with a means selected from the group consisting of MOCVD, CVD, molecular beam epitaxy, atomic layer epitaxy, laser ablation, hydride vapor phase epitaxy, vapor phase epitaxy, and combinations thereof In some of these embodiments, the wide bandgap material is doped as it is deposited in the molds. In this in situ manner, p-n junctions can be created within a single wide bandgap nanostructure simply by changing the types of doping agents during the deposition process.

In some embodiments, the wide bandgap and nucleation layer materials are selected utilizing three-dimensional models, as described herein. Such models are used to help generate wide bandgap nanostructures which are energetically unfavorable for dislocation formation and which are, consequently, low in defects.

In some embodiments of the present invention, the etchable sacrificial dielectric layer is removed, after the formation of the wide bandgap nanostructures, by a chemical, thermal, or radiative means.

In some embodiments of the present invention, the electrode material is deposite by a technique selected from the group consisting of thermal evaporation, e-beam evaporation, laser ablation, sputtering, electroplating, direct application, and combination thereof.

In some embodiments of the present invention, the substrate and/or nucleation layer is n-type. The nanostructures of wide bandgap material (e.g., AlInGaN) are undoped and a p-doped or p+-doped material (e.g., GaN) is deposited as an overlayer, as in 205 in FIG. 2.

In some embodiments, a potential is applied between the top and bottom electrodes to effect electroluminescence. This applied potential typically ranges from about 2 volts (V) to about 20 V, and more typically from about 3 V to about 5 V. Electroluminescence produced in this manner typically comprises one or more wavelengths which range from about 200 nm to about 1780 nm. In some embodiments, the electroluminescence is polychromatic and provides white light. In other embodiments, the electroluminescence is monochromatic and/or coherent for use as a laser diode. In some embodiments, the electroluminescence can be tuned by a method selected from the group consisting of quantum confinement, surface confinement, and combinations thereof.

Monodisperse QDs for Laser Diodes

In some embodiments of the present invention, surface bound quantum dots are used for laser diodes. In such embodiments, device fabrication is similar to that of white LEDs, but in this case special care is taken to form uniform, monodisperse QDs capable of producing one characteristic wavelength. A resonant cavity within the device must also be formed using metallic mirrors, Bragg reflectors, index-offsets, etc. Monodisperse quantum dots such as these can also be used as noncoherent emitters for the generation of highly efficient light at one or more wavelengths.

Figure 3:
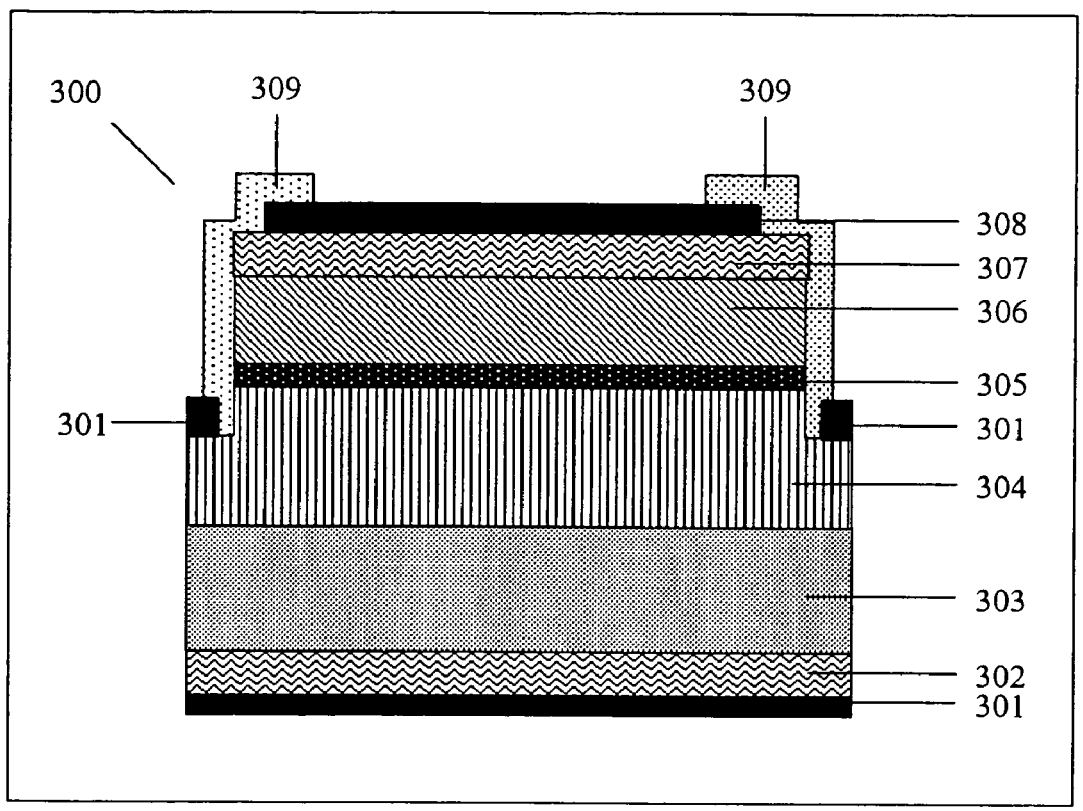
FIG. 3 illustrates a laser diode configured in accordance with an embodiment of the present invention.

To better illustrate a laser diode constructed with monodisperse nanostructures, like quantum dots, reference is now made to FIG. 3, wherein 301 is a first transparent/semi-transparent contact metal (n-type or p-type) or ITO, 302 is a first external Bragg reflector, 303 is a substrate, 304 is a first cladding and can be either n-type or p-type (this cladding and the substrate can be the same), 305 is an active layer comprising a single layer of monodisperse nanostructures, 306 is a second cladding and can be either p-type or n-type, 307 is a second external Bragg reflector, 308 is a second transparent/semi-transparent contact metal (p-type or n-type) or ITO, and 309 is passivation.

Other Optoelectronic Devices

Variations on the present invention include an optoelectronic detector. This is essentially just operating the LEDs described herein—in reverse. Such a device could be made to be selective to one or more wavelengths of EM radiation by tailoring the wide bandgap nanostructures using quantum confinement and/or surface elasticity effects. The detector could also be made to detect radiation spatially by careful arrangement of the nanostructures on a surface. Such diode array detectors are currently used in a number of spectroscopic applications, but the present invention provides an alternative method for making them. Still other applications include uses as sensors, microelectrical mechanical systems (MEMS), nanoelectrical mechanical systems (NEMS), and field emitters.

EXAMPLES

The following examples are presented to further illustrate the invention and are not to be construed as unduly limiting the scope of this invention.

Example 1

This example serves to illustrate the role modeling plays in determining optimum material selection for the wide bandgap material nanostructures and the substrate/nucleation layer.

Figure 4:
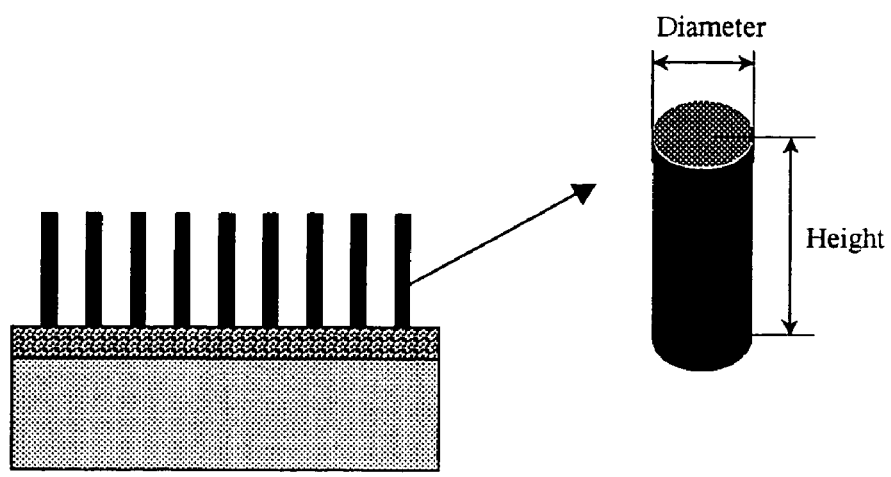
FIGS. 4A and B illustrate zero dislocation density maps (B) for different nano-island/substrate configurations of cylindrical shape (A)
Figure 4:
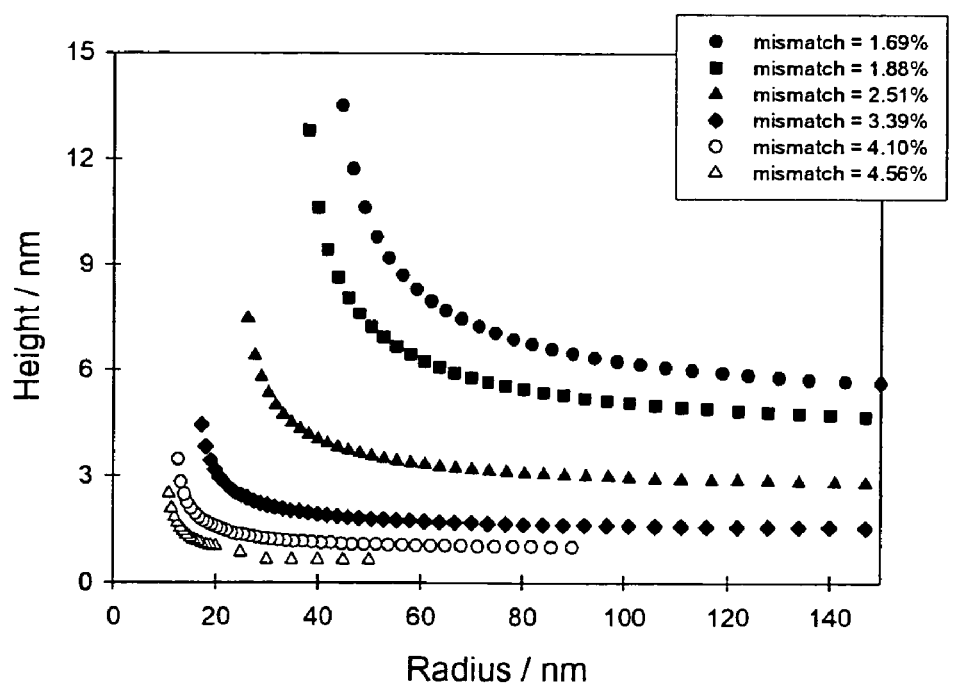

A three-dimensional model has been developed to help predict and optimize the nano-template chemical composition, geometry, and dimensions for which low-defect wide band gap nanostructures are obtained. The models for misfit dislocation nucleation are formulated with the aid of numerical finite element simulations and approximate dislocation energetics, and are an extension of the Jain and Atkinson models for 2-dimensional stripes into 3-dimensions (Atkinson et al., J. Appl. Phys., 72, p. 2242, 1992); Jain et al., J. Appl. Phys., 78, p. 1630, 1995; Atkinson et al., J. Appl. Phys., 77, p. 1907, 1995). One of the outputs of the model is a dislocation density map for various nano-island chemical composition, shape, and dimension combinations. In particular, critical combinations (i.e., cylinder radius and height, like that shown for nanostructure 105 in FIG. 4A) for which nano-islands that are dislocation-free are predicted. FIG. 4B illustrates plots of dislocation-free contour curves for various degrees of lattice mismatch between the nanostructure and the substrate. $\Delta \in \%$ in the figure represents the magnitude of lattice mismatch between the nanostructure and substrate. The contour curves in FIG. 4B have been normalized and are thus material-independent. Consequently, these curves can be considered as master curves. For example, for a given nanostructure/substrate combination and a knowledge of the lattice mismatch for that combination, one can estimate the critical nanostructure dimensions for which no dislocations are developed.

Figure 5:
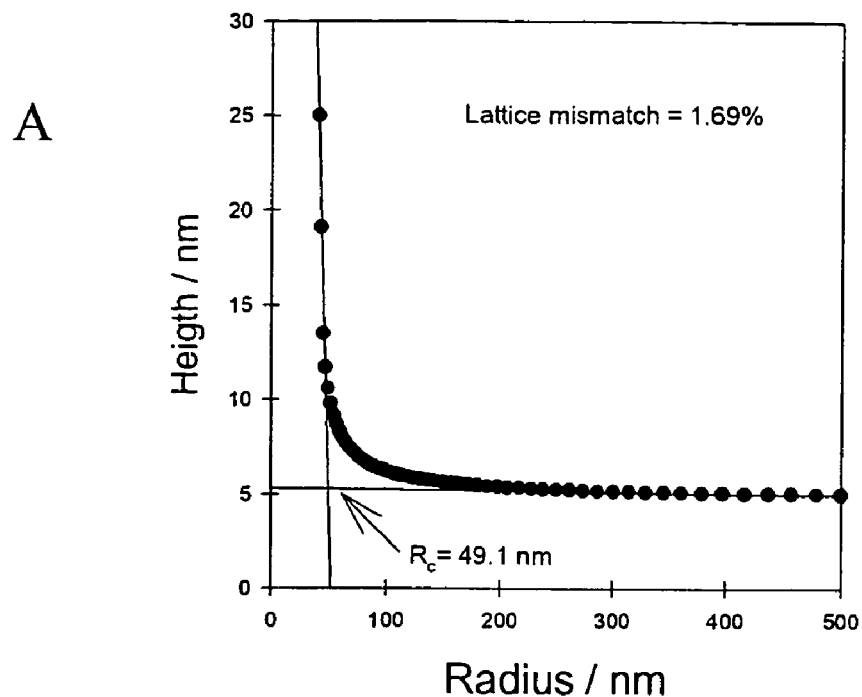
FIGS. 5A and B illustrate how the critical radius, $R_c$, for a nano-island/subtrate configuration varies as a function of lattice mismatch.
Figure 5:
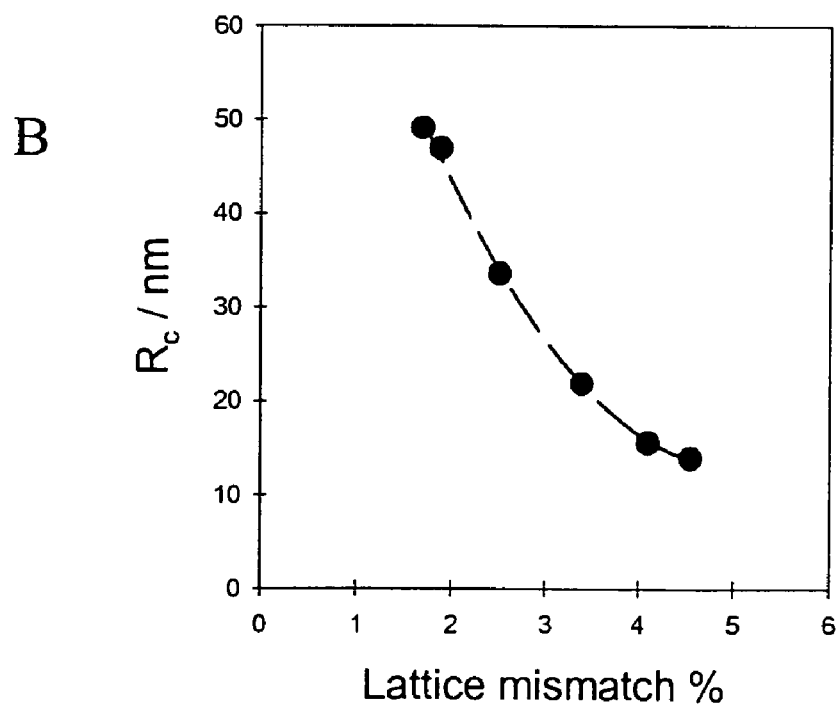

When the nano-island radius is large, the dislocation-free contour curve asymptotically converges to a thin film limit solution. However, for smaller nano-island radii, significant deviation from the two-dimensional thin film is observed. In fact, below a critical radius, $R_c$, dislocation-free contour curves are dominated by three-dimensional confinement effects. FIG. 5A, shows a typical dislocation-free contour curve ($\Delta \in = 1.69\%$), where the asymptotes of the thin film and 3-D confined limits intersect at the critical radius $R_c$. FIG. 5B shows the variation of $R_c$ as a function of lattice mismatch. As expected, $R_c$ decreases monotonically as a function of lattice mismatch. However, it is important to highlight that even for large values of $\Delta \in$ (for instance 5%), experimentally feasible critical dimensions, for which no dislocations are developed, are obtained.

Example 2

This example serves to illustrate the nanolithographic process using block co-polymer lithography as an exemplary nanolithographic means.

Figure 6:
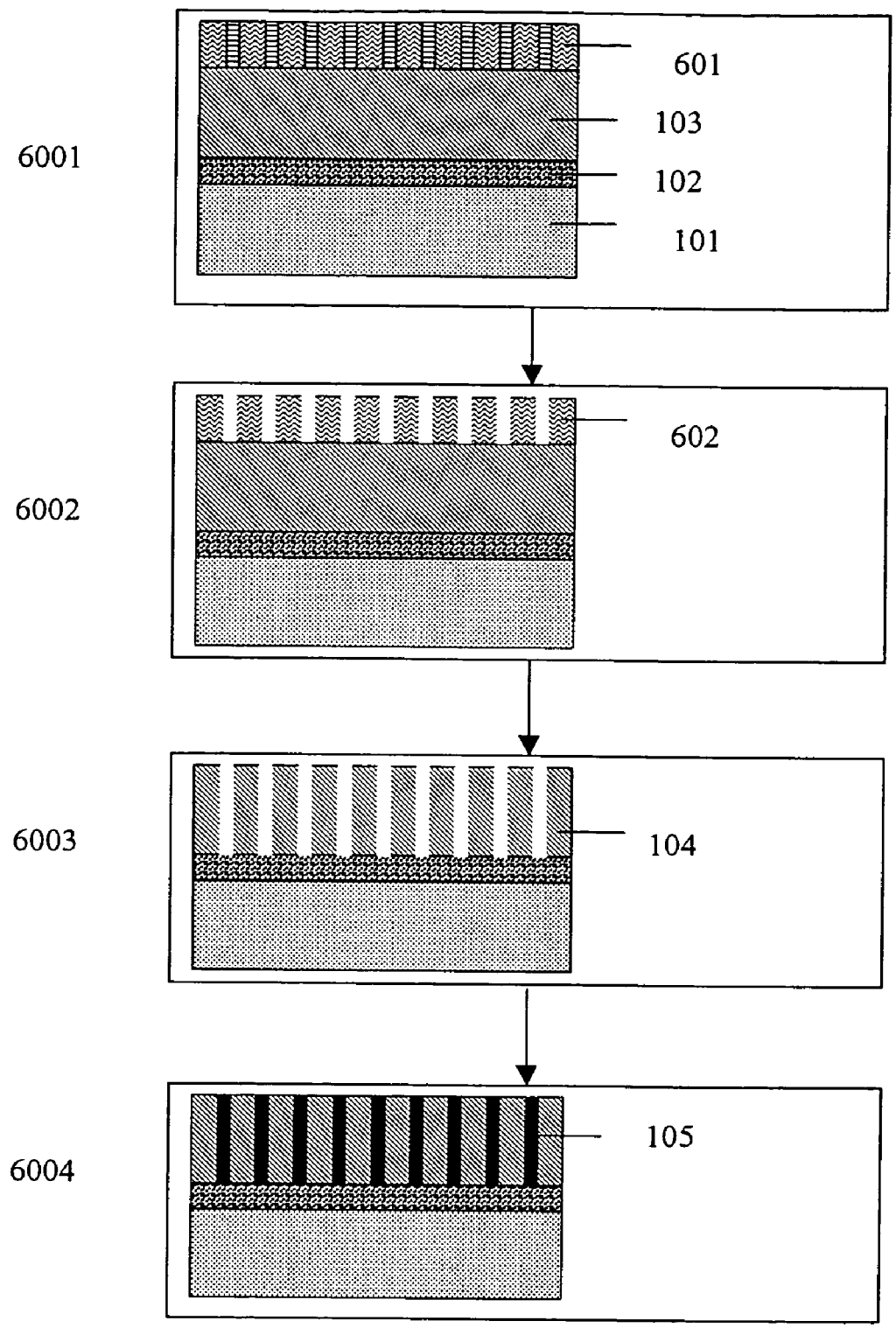
FIG. 6 illustrates nanopatterning of a sacrificial mask using block co-polymer lithography.
Figure 7:
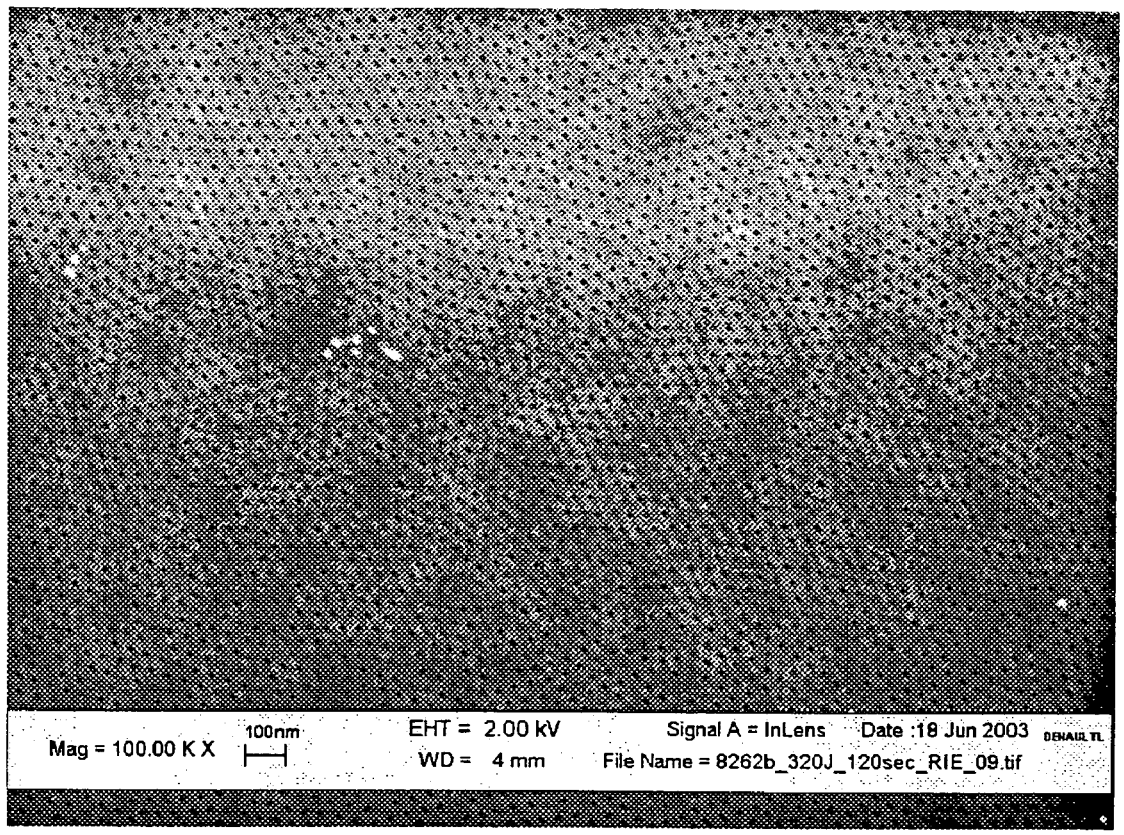
FIG. 7 is a scanning electron micrograph of a surface that has been nanolithographically patterned using block copolymer lithography.

Referring to FIG. 6, a self-assembled block co-polymer thin film 601 (e.g., PS-PMMA) is deposited on top of the sacrificial dielectric layer 103 in step 6001. Selective removal of one of the block co-polymer phases with chemical and/or radiation treatments yields a nano-lithographic mask composed of a nano-porous polymeric film 602, as shown in step 6002. In step 6003, chemical treatment and/or reactive ion etching (RIE) and pattern transfer to the sacrificial layer yields the nano-porous template or mold 104 in which wide bandgap material nanostructures 105 can be grown as in step 6004. FIG. 7 depicts a scanning electron micrograph of a surface that has been patterned using block co-polymer lithography.

Example 3

This example serves to illustrate the effect of surface elasticity on the emission properties of "embedded" wide bandgap nanostructures.

As mentioned in the background section, at the nanoscale, size-related quantum confinement effects have a large influence on the emission wavelength of light. Applicant has recently demonstrated that surface elasticity (nano-strain) effects at the nanoscale level can also cause a dramatic shift in the emission wavelength of embedded quantum dot nanostructures (Sharma et al., Phys. Stat. Sol. B, 234(3), R10–R12 (2002); Sharma et al., "Effects of Surface Elasticity in Nano-Inhomogeneities, Nanocomposites, and Quantum Dots," ASME Mechanics of Materials Conference, Scottsdale, Ariz. (2003); both of which are incorporated herein by reference). Hydrostatic strain state within a QD structure is known to impact that structure's optoelectronic properties. Several works, of varying sophistication (both analytical and numerical), have focused on the "accurate" calculation of the strain state in buried quantum dots. However, the previously unconsidered interfacial elastic properties can significantly alter the strain calculations, the exact correction being sensitively dependent upon the size of the QD structure and the interfacial elastic constants. As an example, excluding the strain correction based on surface/interfacial elasticity for a spherical InGaN quantum dot buried in a GaN matrix can lead to an overestimation of the strain by 25%. When translated into the strain effect on bandgap, calculations suggest (using a effective mass model and the deformation potential theory) that at a size of 2 nm, the bandgap shift due to surface effects is strong enough to change the emission wavelength from red to green. These calculations are valid for both colloidal nanocrystals (quantum dots) and substrate-supported nanostructures such as the templated grown nanowires that are completely or partially embedded in a matrix.

Figure 8:
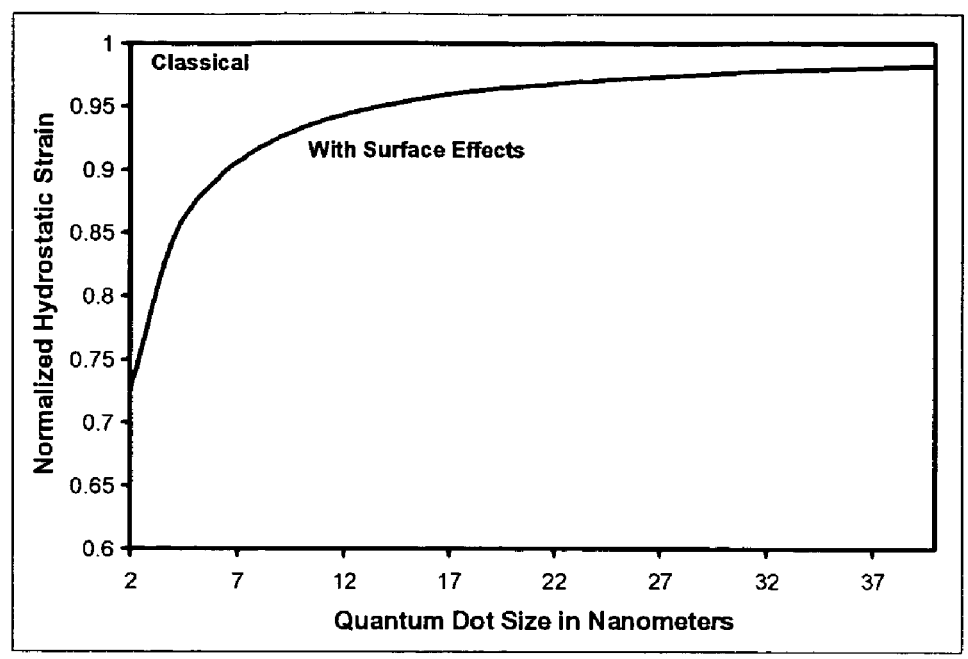
FIGS. 8A and B illustrate nanoscale confinement effects due to reduced size and surface elasticity effects.
Figure 8:
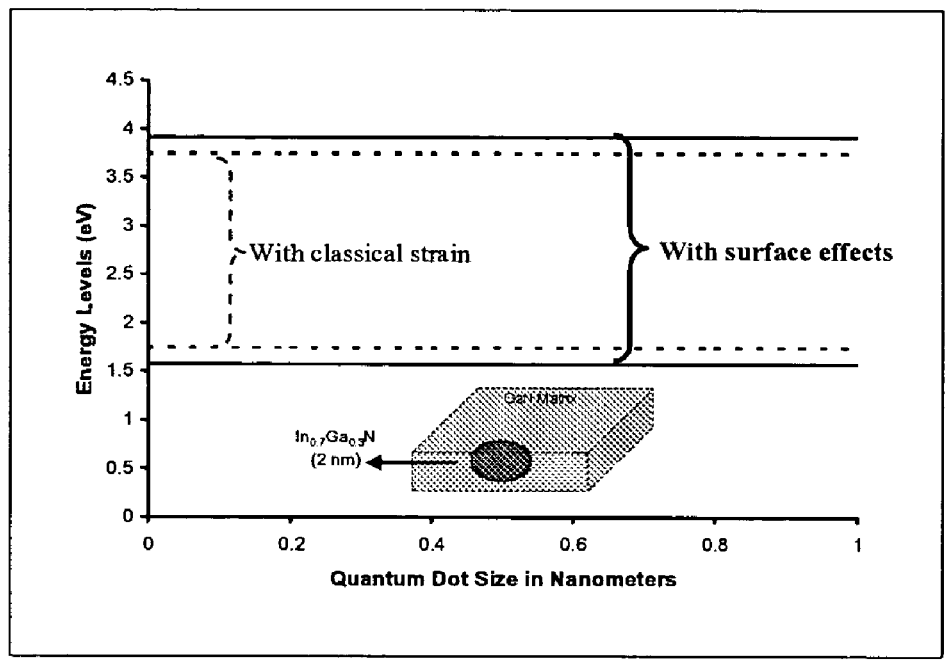

The contribution of surface elasticity effects is demonstrated in FIG. 8, where FIG. 8A depicts the size dependency of strain due to surface elasticity effects in InGaN quantum dots embedded in a GaN matrix, and FIG. 8B depicts how the emission wavelength of 2 nm AlGaN quantum dots embedded in a GaN matrix is green ($\lambda$=531 nm) as compared to the red emission ($\lambda$=620 nm) of the quantum dot with no surface elasticity effect included. Combining the size and surface elasticity effects provides greater flexibility in tuning the emission wavelength of embedded wide-band gap nano-structures, including InN, AlGaN, and other binary, tertiary and quaternary compounds, such as $Al_xIn_yGa_{1-x-y}N$, where $0 \leq x, y, x+y \leq 1$. The wide-band gap nanostructures may be embedded in a variety of matrices, including porous $SiO_2$ or $Si_xN_y$ where similar effects are expected. The optimum size for the observation of quantum confinement effects depends mainly on the Bohr exciton radii of the bulk semiconductor compounds. In non-embedded wide-bandgap semiconductors, quantum confinement effects are generally observed for quantum dots with diameters below about 5 nm, but some materials exhibit such an effect below about 10 nm. For embedded wide bandgap quantum dots, however, quantum effects are expected for even larger quantum dots (up to about 20 nm) due to the combination of size and surface elasticity effects. This observation is very important, since nanostructures of larger sizes are easier to manufacture.

Example 4

This example serves to illustrate some alternative designs for the white LED devices of the present invention.

Figure 9:
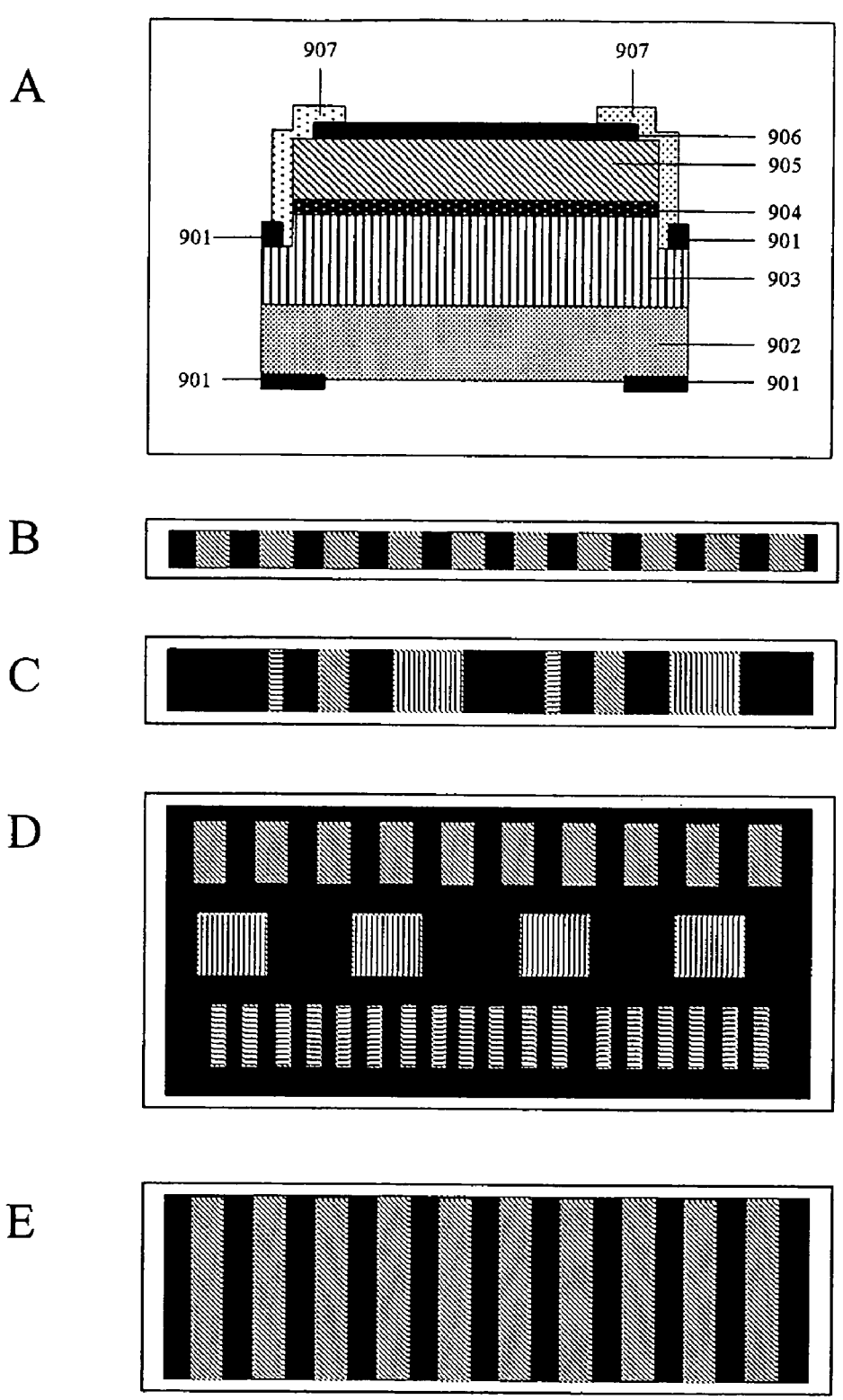
FIGS. 9A–E illustrate additional designs of white light emitting for embodiments of the present invention.

FIG. 9A–E capture some alternative designs for white LED devices based on engineered quantum dots or other wide bandgap nanostructures. FIG. 9A illustrates a general design, wherein 901 is a first contact metal of n-type or p-type, 902 is a substrate, 903 is a first cladding of n-type or p-type (can be the same material as the substrate), 904 is a nanostructured active region comprising the engineered quantum dots or other wide bandgap nanostructures, 905 is a second cladding (can be the same material as the substrate and/or the first cladding), 906 is a second contact metal of n-type or p-type, and 907 is passivation. FIG. 9B illustrates an embodiment wherein 904 comprises a single layer of monodisperse nanostructures. FIG. 9C illustrates an embodiment wherein 904 comprises a single layer of varying size nanostructures. FIG. 9D illustrates an embodiment wherein 904 comprises multiple layers of nanostructures of varying size. FIG. 9E illustrates an embodiment wherein 904 comprises a single layer of elongated monodisperse nanostructures.

Variations of the basic device design include: use of $Al_xIn_yGa_{1-x-y}N$ with a higher bandgap than the quantum dots for confinement of the latter rather than $SiO_xN_y$; incorporation of one or more $Al_xIn_yGa_{1-x-y}N$ cladding layers between the substrate and quantum dots and/or between the quantum dots and the upper electrode in order to provide electrical confinement of the carriers and/or optical confinement of photons in a laser; reversal of polarity, with p-type material below the quantum dots and n-type material above; and lateral devices, where both electrical contacts are provided on the upper side of the device rather than one above and one below.

Although the present invention has been described with respect to specific embodiments, the details thereof are not to be construed as a limitation, for it will be apparent to those of skill in the art that various embodiments, changes and modifications may be resorted to without departing from the spirit and scope thereof, and it is understood that such equivalent embodiments are intended to be included within the scope of the present invention.

What is claimed is:

1. A device comprising:

a) a substrate; and b) nanostructures of wide bandgap material, wherein the nanostructures of wide bandgap material comprise an n-type portion and a p-type portion, and wherein the nanostructures of wide bandgap material are selected from the group consisting of low-defect nanostructures of wide bandgap material, quantum confined nanostructures of wide bandgap material, surface confined nanostructures of wide bandgap material, and combinations thereof, and wherein the nanostructures of wide bandgap material are selected from the group consisting of quantum dots, quantum wires, and combinations thereof.

2. The device of claim 1, wherein the substrate comprises a conductive material.

3. The device of claim 1, further comprising a nucleation layer interposed between the substrate and the nanostructures of wide bandgap material.

4. The device of claim 3, wherein the substrate comprises a material selected from the group consisting of SiC, sapphire, ZnO, doped Si, AlN, InN, AlGaN, AlInGaN, LiGaO$_2$, SiO$_2$, diamond, and combinations thereof.

5. The device of claim 3, wherein the nucleation layer comprises a material selected from the group consisting of GaN, InGaN, AlN, InN, BN, B$_x$Al$_y$In$_z$Ga$_{1-x-y-z}$N, and combinations thereof.

6. The device of claim 3, wherein the nucleation layer and the wide bandgap nanostructures comprise a common material.

7. The device of claim 1, wherein the substrate comprises bulk GaN, wherein the bulk GaN has a dislocation density of less than about $10^4$ cm$^{-2}$.

8. The device of claim 1, wherein the wide bandgap nanostructures comprise a material selected from the group consisting of group III nitrides, III–V semiconductors, II–VI semiconductors, Al$_x$Ga$_{1-x}$As, In$_x$Ga$_{1-x}$As, II–VI semiconductors, AlP, AlAs, AlSb, GaP, GaN, GaAs, GaAs, GaSb, InP, InAs, InSb, SiC, ZnO$_2$, and combinations thereof.

9. The device of claim 1, wherein the wide bandgap nanostructures are selected from the group consisting of nanostructures that are homogeneous in size and shape, nanostructures that are heterogeneous in size and shape, and combinations thereof.

10. The device of claim 1, wherein the p-type portion of the wide bandgap material is p-doped with atoms selected from the group consisting of Zn, Mg, Mn, C, Co, Ca, Ra, Be, Sr, Ba, Zn, Ga-vacancies, and combinations thereof.

11. The device of claim 1, wherein the n-type portion of the wide bandgap material is n-doped with atoms selected from the group consisting of oxygen, Si, Co, C, nitrogen vacancies, and combinations thereof.

12. The device of claim 1, wherein the wide bandgap nanostructures are arranged with a density which ranges from about $10^8$ nanostructures per square centimeter to about $10^{12}$ nanostructures per square centimeter.

13. The device of claim 1, further comprising electrodes, wherein at least one electrode is in ohmic contact with an n-type region and at least one electrode is in ohmic contact with a p-type region of the nanostructures of wide bandgap material.

14. The device of claim 13, wherein said device is operable as a solid state optical emitter.

15. The device of claim 14, wherein said device is operable as a light emitting diode.

16. The device of claim 14, wherein said device is operable as a laser diode.

17. The device of claim 14, wherein said device provides for light selected from the group consisting of polychromatic radiation, monochromatic radiation, coherent radiation, and combinations thereof.

18. The device of claim 1, further comprising at least one cladding layer.

* * * * *